VARIABLE GAIN AMPLIFIER WITH CONSTANT FEEDBACK LOOP GAIN

Filed Oct. 8, 1968

United States Patent Office 3,467,913

Patented Sept. 16, 1969

3,467,913

VARIABLE GAIN AMPLIFIER WITH CONSTANT FEEDBACK LOOP GAIN

Masao Kawashima, Yokohama-shi, and Tsukumo Higeta and Gen Kakehi, Kawasaki-shi, Japan, assignors to Fujitsu Limited, Kawasaki, Japan, a corporation of Japan Continuation-in-part of application Ser. No. 702,759, Feb. 2, 1968. This application Oct. 8, 1968, Ser. No. 784,497

Claims priority, application Japan, May 28, 1964, 39/29,951

Int. Cl. H03f *1/36*

U.S. Cl. 330—110 5 Claims

ABSTRACT OF THE DISCLOSURE

The feedback loop connected between the output and input of an amplification stage has a non-linear component and a feedback resistor. The non-linear component comprises a resistor and a pair of diodes connected in parallel with each other. A load resistor is connected in series with the non-linear component. The series connection of the load resistor and the non-linear component is connected between the output and a point at ground potential. The non-linear component functions as a load impedance and a feedback impedance at the same time.

The present application is a continuation-in-part of copending application Ser. No. 702,759, filed Feb. 2, 1968, which copending application is a continuation of application Ser. No. 458,792, filed May 25, 1965, and now abandoned.

The present invention relates to a variable gain amplifier. More particularly, the invention relates to a variable gain amplifier having a feedback loop.

The principal object of the present invention is to provide a new and improved variable gain amplifier.

An object of the present invention is to provide a variable gain amplifier having a stable variable gain.

Another object of the present invention is to provide a variable gain amplifier having a broad band stable operation and a stable variable gain.

Another object of the present invention is to provide a new and improved compression amplifier.

Another object of the present invention is to provide a compression amplifier which operates with efficiency, reliability and precision.

Another object of the present invention is to provide a compression amplifier having a high speed of operation.

In accordance with the present invention, a variable gain amplifier having an amplification stage, an input to the amplification stage, and an output from the amplification stage, includes a feedback loop connected between the output and the input. The feedback loop includes a non-linear component comprising a first diode connected in a conducting direction from the input to the output, and a second diode connected in parallel with the first diode in a conducting direction from the output to the input. The non-linear component functions as a load impedance and a feedback impedance at the same time.

In order that the present invention may be readily carried into effect, it will now be described with reference to the accompanying drawings, wherein.

In the figures, the same components are identified by the same reference numerals.

The variable gain amplifier of the present invention is of the compression amplifier type. A compression amplifier is one in which the effective gain applied to a signal is varied as a function of the signal magnitude, the effective gain being greater for small signals. The variable gain amplifier of the present invention is of the broad band type which provides a higher gain for a lower magnitude signal and a lower gain for a higher magnitude signal. The variable gain amplifier of the present invention functions as a summing or adding amplifier, in which addition and subtraction operations are performed and in which a plurality of input signals are amplified.

Figure 1:
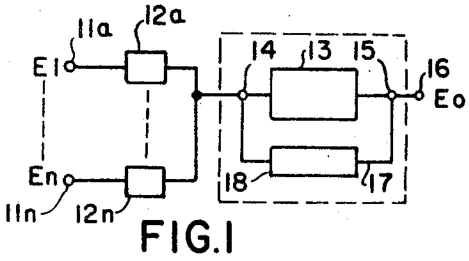
FIG. 1 is a schematic block diagram of a variable gain amplifier.

A variable gain amplifier of the type schematically indicated in FIG. 1, which functions as a broad band summing amplifier to provide addition of a plurality of input signals and high gain amplification of such input signals, is especially adapted for use in a high speed feedback encoder, and in an analog digital converter, as well as other applications. In these applications, it is necessary to provide, at high speed and great precision, comparative operation and detection of input signals to be converted as well as other signals. The sum of the plurality of input signals, which is the magnitude of the resultant sum signal, has a very wide dynamic range, especially when the amplifier operates in a high precision encoder. The impedance of the source of each of the plurality of input signals is not constant, but most often varies in accordance with the signal level or magnitude.

Due to the variation of the signal source impedances, in order to provide a high precision addition operation, a high feedback loop gain in the required band is necessary. However, when a high gain is required, the amplifier may become overloaded when the resultant sum input signal level is high. In a feedback encoder a high gain is required only when the resultant sum signal of the inputs is small, that is, near the threshold level, whereas it is not of importance if the amplifier becomes overloaded in the range in which the resultant sum signal level is large. Where high precision and high speed gain in operation are required, however, such as, for example, in a high speed encoder summing amplifier, the speed of operation or the transmission bandwidth must have the same characteristics in the overload region as in the linear region.

In FIG. 1, a plurality of input signals having voltages *El* . . . E*n* are applied to a plurality of corresponding input terminals 11*a* . . . 11*n*. Each of the input terminals 11*a* to 11*n* is connected through a corresponding input signal source impedance 12*a* . . . 12*n* to an amplification stage 13. The amplification stage has an input 14, to which the input signals from the input signal source impedances 12*a* to 12*n* are supplied, and an output 15 from which its output is derived. An output voltage EO is provided at an output terminal 16 connected to the output 15 of the amplification stage 13. A feedback loop 17, having a feedback impedance 18 is connected between the output 15 and the input 14 of the amplification stage 13.

In the variable gain amplifier of FIG. 1, when the gain $\mu\beta$ of the feedback loop 17 is sufficiently large relative to 1, the input impedance of the amplification stage 13 becomes very small. The gain $\mu$ of the amplification stage 13 then approximates the ratio of feedback impedance 18 to input signal source impedance 12*a* to 12*n*. This ratio $\mu$ may be defined as $Zf/Zi$. Accordingly, when each of the input signal source impedance $Zi$ and feedback impedance $Zf$ are resistive in nature, as opposed to inductive, capacitive, or combinations of these, the circuit of FIG. 1 operates as an adding or subtracting amplifier. When the feedback impedance $Zf$ is inductive in nature, as opposed, to resistive or capacitive, the circuit of FIG. 1 operates as a differentiating amplifier. When the feedback impedance $Zf$ is capacitive in nature as opposed to resistive or inductive, the circuit of FIG. 1 operates as an integrating amplifier.

When the input impedance $Zi$ varies, as in the operation of an adding or summing amplifier of a feedback encoder, the amplifier functions to perform linear addition and subtraction of signals regardless of variation of the impedance. In a feedback encoder, however, the amplifier need not function as a proportional adding amplifier of high precision over the entire range of input signal levels, but need only detect with high precision the difference from a determined threshold level. Accordingly, when the input signal resultant sum is very large, the amplifier operates in overloaded or saturated condition, since a large gain is required in order to provide high precision detection.

The speed of operation of an adding amplifier of the type of FIG. 1 is determined by the frequency bandwidth having the required feedback loop gain. When the amplifier operates in its non-linear region, including its overload condition, the speed of operation decreases considerably, the speed of operation being influenced by the operation in the overload region. Thus, when a high speed of operation is necessary, the amplifier should not be overloaded. When the level of the resultant sum of the input signals is very large and a high gain is required, however, it is extremely difficult to operate the amplifier linearly in the entire range of input signal levels. This is due to the consumption rating and maximum voltage rating of the amplifier. It is therefore necessary to provide proper gain regulation by means other than that of the amplification stage. Such other means has been proposed, as shown in FIG. 2.

Figure 2:
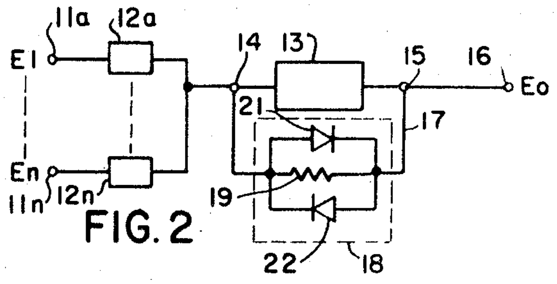
FIG. 2 is a schematic block diagram of a variable gain amplifier.

FIG. 2 is a variable gain amplifier which functions as a compression amplifier. The variable gain amplifier of FIG. 2 has a non-linear component in its feedback loop. The feedback loop 17 is a shunt feedback, as in FIG. 1. The feedback loop 17 comprises a feedback resistor 19 connected between the output 15 and the input 14 of the amplification stage 13. The feedback resistor 19 has a high resistance and forms part of the feedback impedance 18, as do the other components of the feedback loop. A first diode 21 is connected in parallel with the feedback resistor 19 in a conducting direction from the input 14 to the output 15, its anode being connected to said input and its cathode being connected to said output. A second diode 22 is connected in parallel with the feedback resistor 19 in a conducting direction from the output 15 to the input 14, its anode being connected to said output and its cathode being connected to said input. When the gain $\beta$ of the feedback loop is very large, the input impedance of the amplification stage 13 may be considered to be approximately zero, so that the output voltage EO itself is applied to the feedback impedance 18 which is symbolized by $Zf$ and which comprises the parallel connected resistor 19 and diodes 21 and 22. As the output voltage EO increases, the resistance presented by one of the diodes 21 and 22 decreases. Since the gain $\mu$ of the amplification stage is $Zf Zi$, such gain is proportional to the feedback impedance $Zf$, so that as the output voltage EO increases and the feedback impedance $Zf$ decreases, the gain $\mu$ of the amplification stages decreases. When the magnitude of the input signal is very small, the output voltage EO is small, so that the feedback impedance is large and the gain $\mu$ of the amplification stage 13 increases. Overloading of the amplification stage 13 is thus avoided and a high speed of operation is attained.

In FIG. 2, since only the feedback impedance is felt to control the gain, the gain $\beta$ of the feedback loop is inversely proportional to the gain $\mu$ of the amplification stage 13. That is, the gain $\beta$ of the feedback loop is small when the input voltage has a small magnitude and said gain is large when the input voltage has a large magnitude. However, in an adding amplifier, the gain is required at a high speed of operation and at high precision when the input voltage has a small magnitude, but high precision operation is not necessary when the input voltage has a large magnitude. It is accordingly necessary to provide a gain and bandwidth in the feedback loop corresponding to the required high precision and speed of operation when the feedback signal is a minimum. The gain of the feedback loop thus becomes very large as the magnitude of the input signal becomes large.

Figures 3, 4:
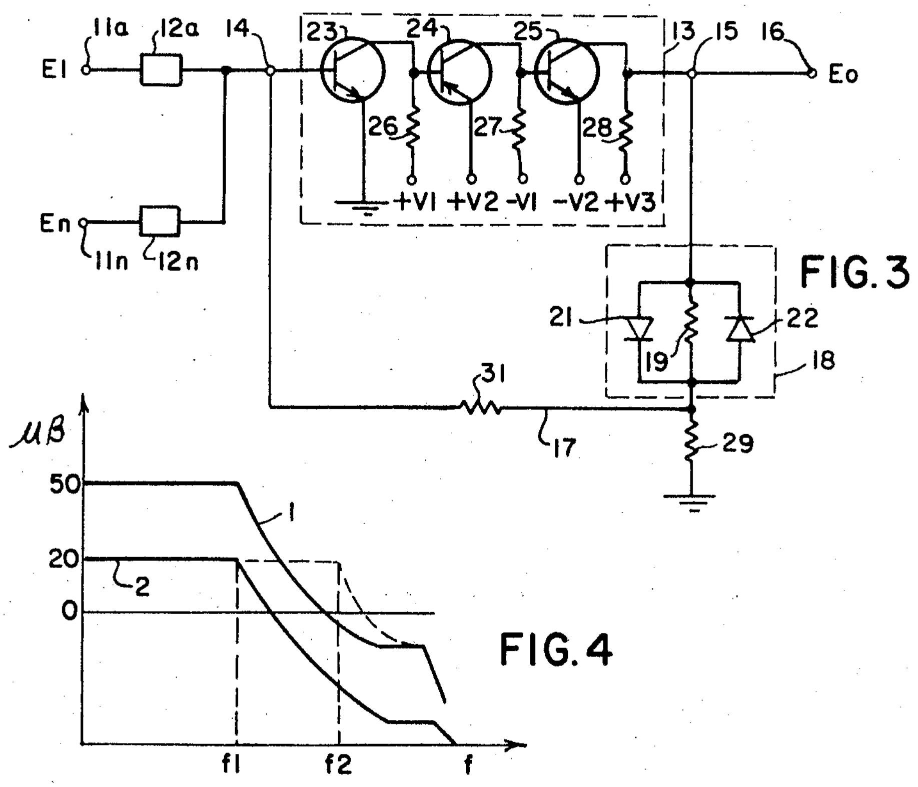
FIG. 3 is a circuit diagram of an embodiment of the variable gain amplifier of the present invention.
FIG. 4 is a graphical presentation illustrating the operation of the variable gain amplifier of FIG. 2.

FIG. 4 illustrates the total gain $\mu\beta$ of the feedback loop. Thus, for example, as illustrated in FIG. 4, when the minimum gain of the feedback loop is 20 db, and the gain control range is 30 db, the gain of the feedbock loop becomes 50 db at the time of overload. In FIG. 4, the abscissa represents the frequency $f$ of the input signal and the ordinate represents the gain of the feedback loop $\mu\beta$. When the magnitude of the input voltage is a maximum, the curve 1 applies. In such case, the range wherein the frequency characteristic is non-variable or constant and stable extends to a frequency $f1$. When the magnitude of the input voltage is a minimum, the curve 2 applies. In such case, the range wherein the frequency characteristic is non-variable or constant and stable extends to a frequency $f2$. However, in order to provide operation of the amplifier with a non-variable and stable frequency characteristic, the bandwidth of the feedback extends to the frequency $f1$, and a considerable portion of the gain is thus utilized. The bandwidth of the feedback that may be utilized in the minimum feedback condition thus becomes very small. This situation is improved by the variable gain amplifier of the present invention, a circuit of an embodiment of which is illustrated in FIG. 3.

In FIG. 3, the feedback impedance 18 is, at the same time, a first load impedance. The feedback and first load impedance 18 comprise a resistor 19 and first and second diodes 21 and 22, respectively, connected in parallel with said resistor. The circuit of FIG. 3 functions as a stable variable gain broad band amplifier having a frequency loop gain which does not vary even when the feedback impedance varies.

In the circuit of FIG. 3, the amplification stage 13 has a gain $\mu$ and may comprise any suitable known amplification stage such as, for example, a plurality of cascade-connected transistors. Thus, for example, the amplification stage 13 may comprise a plurality of cascade connected transistors 23, 24 and 25, each of which is suitably biased by a corresponding one of biasing resistors 26, 27 and 28. The feedback and first load impedance 18 is connected in series with a second load impedance 29. The resistor 19 is thus connected in series with the second load impedance 29 between the output 15 of the amplification stage 13 and a point at ground potential. A second feedback resistor 31 is connected between a point common to the first resistor 19 and the second load impedance 29 and the input 14 of the amplification stage 13. The resistance of the second load 29 is ZL.

In FIG. 3, the gain $\mu\beta$ of the feedback loop is $$\mu\beta=\left[\frac{1}{1+R_b\left(\frac{1}{R_f}+\frac{1}{R_1}+\ldots+\frac{1}{R_n}\right)}\right]\left[\frac{\mu_0 R_L}{R_f}\right]\left[\frac{1}{1+\frac{Z_L+R_L}{Z_0}}\right]$$

wherein $\mu_0$ is the amplification degree of the amplification stage 13, $R_b$ is the input impedance of the amplification stage 13, $R_f$ is the resistance of the feedback resistor 31, $Z_L$ is the feedback impedance 18 which also functions as a load, $R_L$ is the resistance of the load resistor 29, $R_1 \ldots R_n$ are the impedances looking at the input signals $El \ldots$ $En$ from the input 14 of the amplification stage 13, and $Z_0$ is the load impedance connected to the output terminal 16.

When the input impedance $R_b$ of the amplification stage 13 is very small relative to the resistance $R_f$ of the feedback resistor 31 and the impedance $R_1 \ldots R_n$ and $Z_L$, the magnitude $Z_L$ of the feedback impedance 18 and the resistance $R_L$ of the load resistor 29 are very small relative to the load impedance $Z_0$ and the gain $\mu\beta$ becomes $$\mu\beta = \mu_0 R_L / R_f$$

wherein $R_L$ and $R_f$ have constant values. If the foregoing condition is satisfied, the gain $\mu\beta$ of the feedback loop of the circuit becomes constant.

Figure 5:
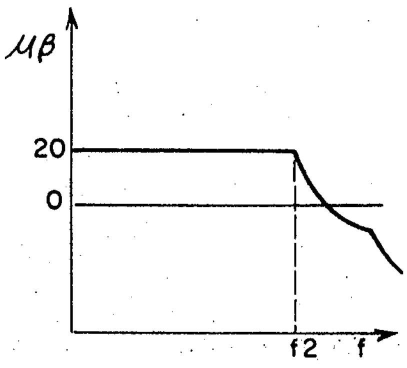
FIG. 5 is a graphical presentation illustrating the operation of the variable gain amplifier of the present invention.

The gain of the feedback loop is thus constant and the amplifier gain varies in accordance with the magnitude of the input signal. In a circuit with such characteristics, the gain characteristics of the feedback loop are adequate if they have the necessary and minimum values, and the circuit structure is thereby facilitated and enables the transmission bandwidth to extend to the frequency $f2$, as shown in FIG. 5. The bandwidth is thus considerably broader than previously. In FIG. 5, the abscissa indicates the frequency $f$ and the ordinate indicates the gain $\mu\beta$ of the feedback loop in db.

The variable gain amplifier of the present invention may thus be utilized as an adding amplifier of a feedback encoder and provides operating gain characteristics which are stable, of high precision and of high speed. The variable gain amplifier of the present invention also provides stable broad band variable gain adding amplifier operation, with high precision operating gain in a low magnitude range of input adding signals. Furthermore, the variable gain amplifier of the present invention provides stable and broad band gain in operation as, for example, a logarithmic amplifier or the like, by utilizing non-linear components in the feedback loop and providing non-linear compression or expansion amplification.

While the invention has been described by means of a specific example and in a specific embodiment, we do not wish to be limited thereto, for obvious modifications will occur to those skilled in the art without departing from the spirit and scope of the invention.

We claim:

1. In an operational variable gain amplifier having an amplification stage having an input impedance, an input for supplying input signals to said amplification stage and an output from said amplification stage, an output load impedance connected to said output, a feedback loop having a stable gain connected between said output and said input and having a non-linear component for varying the feedback impedance of the feedback loop and a feedback resistor connected in series with said non-linear component between said output and said input, the input impedance of said amplification stage being very small relative to the resistance of said feedback resistor and the impedances looking at said input signals from said amplification stage, a load resistor connected in series with said non-linear component, the series connection of said load resistor and said non-linear component being connected between said output and a point at ground potential, and said non-linear component functioning as a load impedance and a feedback impedance at the same time, said feedback impedance and the resistance of said load resistor being very small relative to said output load impedance.

2. In an operational variable gain amplifier as claimed in claim 1, wherein said amplification stage has an output stage and said output stage has a resistor having a high resistance.

3. A variable gain amplifier as claimed in claim 1, wherein said non-linear component comprises a resistor and a pair of diodes connected in parallel with each other.

4. In an operational variable gain amplifier having an amplification stage having an input impedance, an input for supplying input signals to said amplification stage and an output from said amplification stage, an output load impedance connected to said output, a feedback loop having a stable gain connected between said output and said input and having a non-linear component for varying the feedback impedance of the feedback loop and a feedback resistor connected in series with said non-linear component between said output and said input, the input impedance of said amplification stage being very small relative to the resistance of said feedback resistor and the impedances looking at said input signals from said amplification stage, a load resistor connected in series with said non-linear component, the series connection of said load resistor and said non-linear component being connected between said output and a point at ground potential, and said non-linear component functioning as a load impedance and a feedback impedance at the same time, said feedback impedance and the resistance of said load resistor being very small relative to said output load impedance, said non-linear component comprising a first diode connected in series with said load resistor in a conducting direction from said input to said output and a second diode connected in series with said load resistor and in parallel with said first diode in a conducting direction from said output to said input.

5. In an operational variable gain amplifier having an amplification stage having an input impedance, an input for supplying input signals to said amplification stage and an output from said amplification stage, an output load impedance connected to said output, a feedback loop having a stable gain connected between said output and said input and having a first resistor, a first diode connected in parallel with said first resistor in a conducting direction from said input to said output, a second diode connected in parallel with said first resistor and in parallel with said first diode in a conducting direction from said output to said input and a feedback resistor connected in series with the parallel connected first resistor and the first and second diodes between said output and said input, the input impedance of said amplification stage being very small relative to the resistance of said feedback resistor and the impedances looking at said input signals from said amplification stage, a load resistor connected in series with the parallel connection of the first resistor and the first and second diodes, the series connection of said load resistor and said parallel connection being connected between said output and a point at ground potential, said parallel connection functioning as a load impedance and a variable feedback impedance at the same time, said feedback impedance and the resistance of said load resistor being very small relative to said output load impedance.

References Cited

UNITED STATES PATENTS

| | | | |
|---|---|---|---|
| 3,041,535 | 6/1962 | Cochran | 330—110 X |
| 3,112,449 | 11/1963 | Miller. | |
| 3,195,054 | 7/1965 | Richman | 328—146 |
| 3,230,358 | 1/1966 | Davis et al. | 330—110 X |
| 3,304,506 | 2/1967 | Weekes | 328—151 |

ROY LAKE, Primary Examiner

J. B. MULLINS, Assistant Examiner

U.S. Cl. X.R.

330—28, 29